(12) United States Patent
Akizuki

(10) Patent No.: US 6,376,776 B2
(45) Date of Patent: Apr. 23, 2002

(54) CIRCUIT BOARD HOLDER

(75) Inventor: Hideaki Akizuki, Nagoya (JP)

(73) Assignee: Kitagawa Industries Co., Ltd., Nagoya (JP)

(*) Notice: Subject to any disclaimer, the term of this patent is extended or adjusted under 35 U.S.C. 154(b) by 0 days.

(21) Appl. No.: 09/824,981

(22) Filed: Apr. 3, 2001

(30) Foreign Application Priority Data

Apr. 20, 2000 (JP) .......................................... 2000-119544

(51) Int. Cl.⁷ .............................................. H01B 17/00
(52) U.S. Cl. .......................... 174/138 G; 174/138 D; 174/166 S; 24/453; 211/41.1; 361/756; 361/784; 361/804; 403/321; 403/329; 29/829
(58) Field of Search ....................... 174/138 DE, 138 G, 174/157, 166 S; 24/453; 411/501; 211/41.1; 361/756, 784, 788; 403/321, 322.4, 325, 326, 329

(56) References Cited

U.S. PATENT DOCUMENTS

| | | | | |
|---|---|---|---|---|
| 3,216,580 A | * | 11/1965 | Fricker | 211/41.1 |
| 3,646,500 A | * | 2/1972 | Wessely | 437/381 |
| 3,652,899 A | * | 3/1972 | Henschen | 361/784 |
| 3,829,741 A | * | 8/1974 | Athey | 361/756 |
| 4,058,890 A | * | 11/1977 | Pierce et al. | 29/829 |
| 4,530,615 A | * | 7/1985 | Katsuura et al. | 403/321 |
| 4,589,794 A | * | 5/1986 | Sugiura et al. | 174/138 G |
| 4,635,325 A | * | 1/1987 | Yagi | 24/453 |
| 5,309,325 A | * | 5/1994 | Dreher et al. | 361/754 |
| 5,395,177 A | * | 3/1995 | Zhou | 403/321 |
| 5,754,412 A | * | 5/1998 | Clavin | 361/804 |

* cited by examiner

*Primary Examiner*—Dean A. Reichard
*Assistant Examiner*—Adolfo Nino
(74) *Attorney, Agent, or Firm*—Davis & Bujold, PLLC

(57) ABSTRACT

When a sub board is detached from a main board, a movable part is slid toward the main board. At this time, a wedge part of the movable part intrudes between a main part and an engagement part to cause elastic deformation to an extending part of the engagement part, thereby releasing engagement between the engagement part and an engagement receiving part. Even if an operator removes his/her hands from the movable part, the movable part is not displaced away from the main board, and the state in which the engagement part is disengaged from the engagement receiving part is thus maintained. Consequently, after sliding the movable part to release the engagement between the engagement part and the engagement receiving part, the operator can proceed to the next operation of pulling out the sub board.

11 Claims, 8 Drawing Sheets

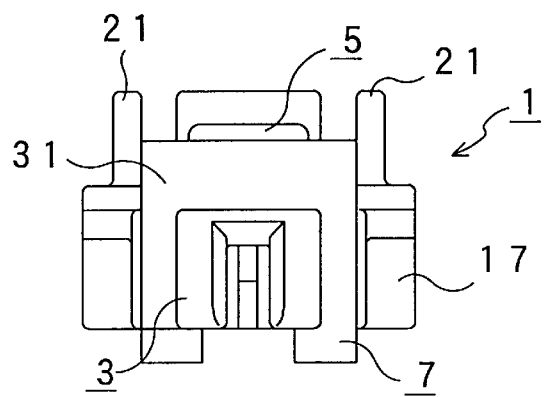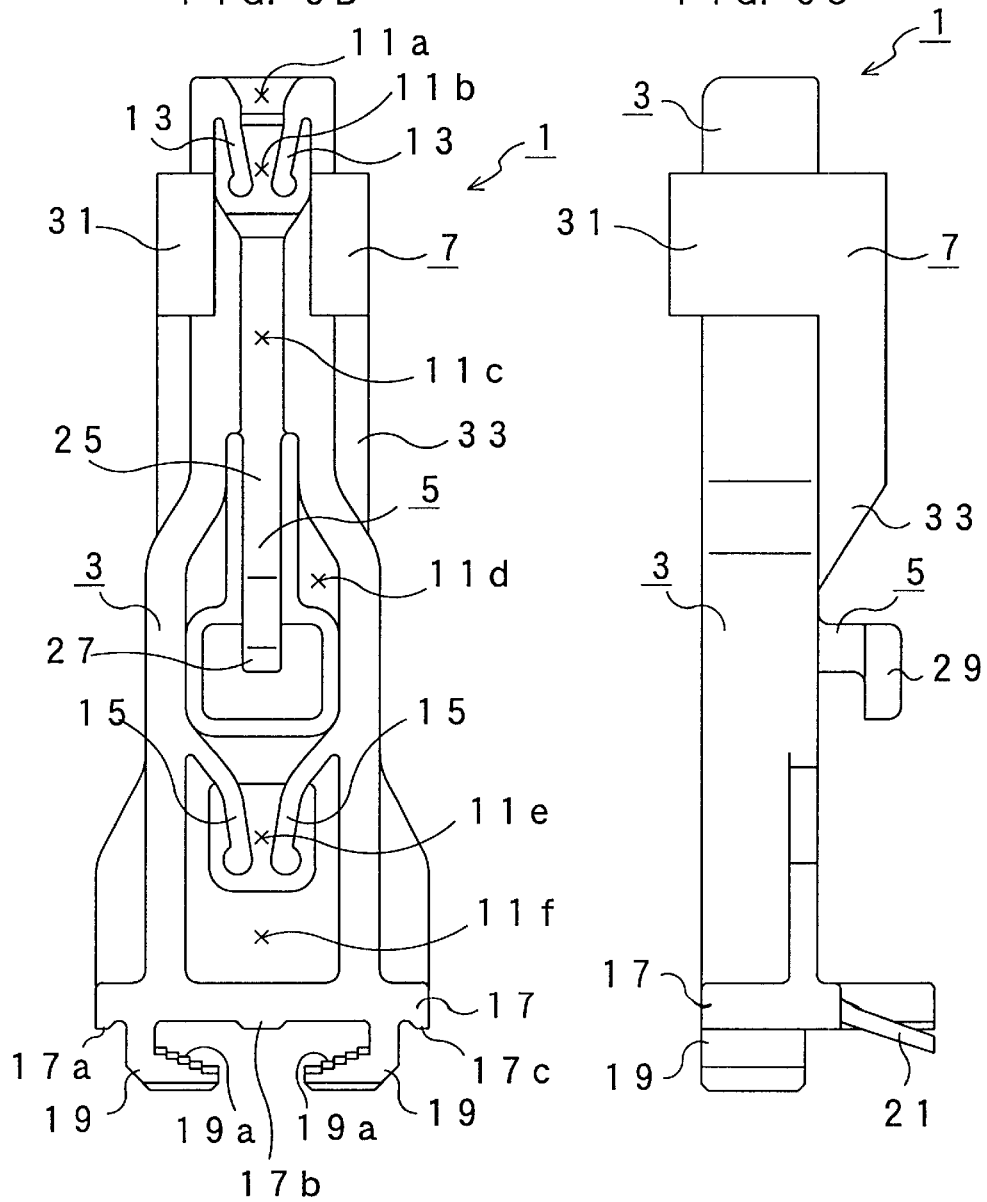

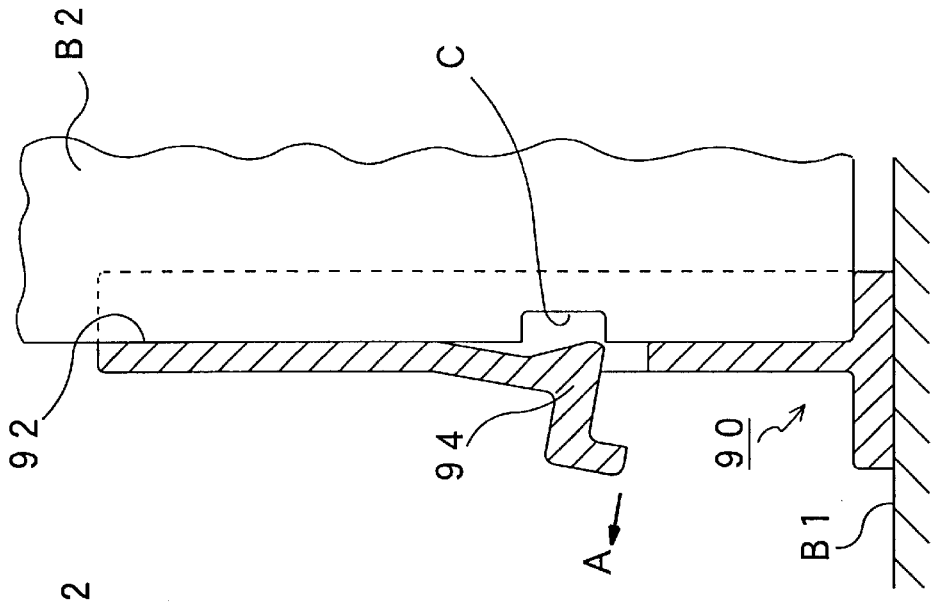
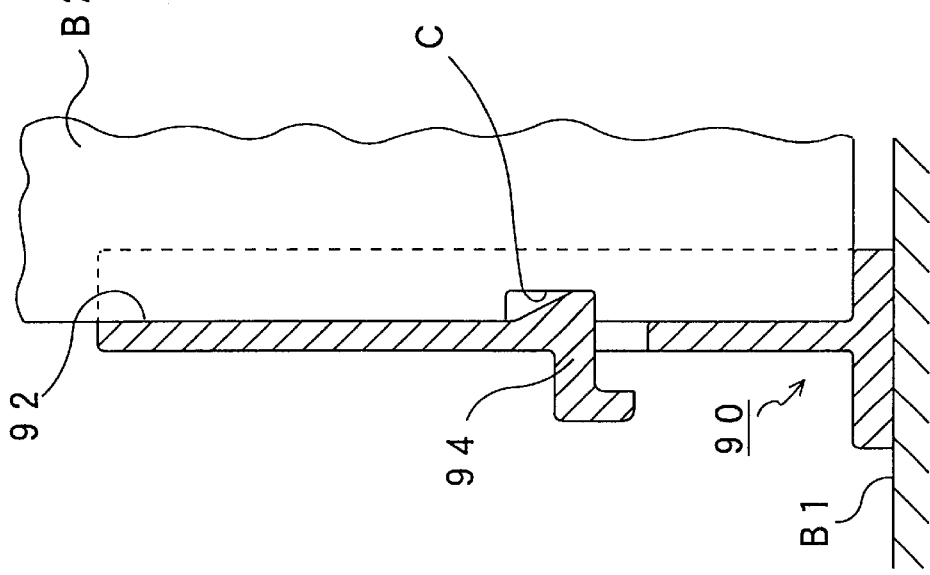

CIRCUIT BOARD HOLDER

FIELD OF THE INVENTION

The present invention relates to a circuit board holder for connecting a circuit board to another component such as a mother board.

BACKGROUND OF THE INVENTION

It is conventionally known to mount on a main printed circuit board (hereinafter referred to as a main board) a printed circuit board other than the main board (hereinafter referred to as a sub board) in a manner in which the sub board is supported substantially perpendicular with respect to the main board. In such a mounting structure, a board holder 90, as shown in FIGS. 8A and 8B, is employed.

The board holder 90 is fixed on the main board B1 and has a groove 92 extended in a direction essentially perpendicular to a surface of the main board B1. The sub board B2 is inserted from an end of the groove 92, and then guided to a proper mounting position along the groove 92.

Once the sub board B2 is inserted in the proper mounting position, an engagement piece 94 provided on the board holder 90 is engaged with an engagement receiving part C formed on the sub board B2. The sub board B2 is thus located in the proper mounting position and prevented from being detached from the board holder 90.

Also, at the same time the sub board B2 is inserted in the proper mounting position, a contact part (not shown) provided at an end of the sub board B2 is inserted into a connector (not shown) disposed on the main board B1, which results in electrical connection between a circuit on the side of the main board B1 and that on the side of the sub board B2. In this state, even if any load acts on the sub board B2, the board holder 90 prevents the load from concentrating on the connector of the main board B1 or the contact part of the sub board B2, thereby protecting the connector and the contact part from being damaged.

Now, in the aforementioned mounting structure for the sub board B2, when the sub board B2 is detached from the main board B1, the engagement piece 94 is pulled with a fingertip in a predetermined direction (a direction shown by an arrow A in FIG. 8B), which results in elastic deformation of the engagement piece 94 to release engagement between the engagement piece 94 and the engagement receiving part C. Then, while the state in which the engagement piece 94 is disengaged from the engagement receiving part C is maintained, the sub board B2 is pulled out. In this way, the sub board B2 is detached from the main board B1.

However, in cases where the sub board B2 is detached in the aforementioned manner, the sub board B2 must be pulled out while the engagement piece 94 is disengaged from the engagement receiving part C. Since at least two board holders 90 are usually provided, an operator needs to use both hands in operating each engagement piece 94. Consequently, another operator is required for an operation of pulling out the sub board B2. That is to say, a detaching operation for the sub board B2 cannot be carried out by one operator, which is a problem with the conventional board holder. Also, it is often the case that such a board holder 90 and a sub board B2 are disposed in an extremely narrow space, such as in a housing of a computer or the like, and therefore, it is sometimes difficult for two or more operators to simultaneously reach into such a narrow space and conduct their respective operations. Accordingly, when the detaching operation for the sub board B2 is carried out by two operators as mentioned above, there is no choice other than that the main board B1 is first taken out of the housing, and then, the sub board B2 is detached from the main board B1, or that obstacles in the housing are first removed to provide a working space within the housing, and then, the sub board B2 is detached from the main board B1. In both cases, however, the detaching operation for the sub board B2 is troublesome, which is another problem with the conventional board holder.

SUMMARY OF THE INVENTION

The present invention was made to solve the aforementioned problems. More specifically, the object of the invention is to provide a board holder with which a detaching operation for a board is able to be carried out more easily than before.

In order to attain this object, according to a first aspect of the invention, there is provided a board holder to be used for fixing a circuit board in a mounting position to a mother board, the board holder comprising a main part fixed in the vicinity of the mounting position, the main part having a groove into which the circuit board is insertable, for guiding the circuit board along the groove into the mounting position; an engagement part for retaining an engagement receiving part formed on the side of the circuit board, when the circuit board is inserted, along the groove of the main part, into the mounting position; and a movable part having a first position where the movable part does not disturb engagement between the engagement part and the engagement receiving part, and a second position where the movable part abuts and displaces the engagement part from retention of the engagement receiving part.

This board holder is to be used in fixing a circuit board (hereinafter simply referred to as a board), such as a printed circuit board or the like, on which various electronic components are to be mounted, on another printed circuit board or any other panel (hereinafter simply referred to as a mounting position).

In the board holder, the main part is fixed in the vicinity of the mounting position for the board, and the structure for fixing the main part in the vicinity of the mounting position is not particularly restricted. For example, the main part may be fixed by inserting a portion formed integrally with the main part into a mounting hole formed on the mounting position. Alternatively, the main part may be fixed by driving a screw, a pin, or the like. Further alternatively, the main part may be fixed by means of adhesive, solder or the like. Also, any other structure for fixing the main part in the mounting position is applicable. The groove formed in the main part should be in such a width and depth that the board, when inserted into the groove, can be held without wobbling. However, as long as the function of holding the board is not lost, it is permissible that the width or depth of the groove is partially varied, a part of a side wall or a bottom face forming the groove is chipped off, or a hole is formed on the side wall or the bottom face. Also, elastic pressing pieces may be provided within the groove, for securing the board, when inserted into the groove, with elastic deformation, thereby preventing the board from wobbling in cases where the board inserted into the groove is thinner than the width of the groove.

The engagement part is engaged with the engagement receiving part formed on the side of the board, when the board is inserted into the mounting position along the groove of the main part. As a specific structure for engagement between the engagement part and the engagement receiving part, well-known structures for engagement are arbitrarily adoptable. A specific shape of the engagement part can be varied according to a specific shape of the engagement receiving part formed on the side of the board. As an example, the engagement part may have an extending piece which is elastically deformable and having a tip which is bent like a hook, while the engagement receiving part may be a concave portion with which the tip bent like a hook can be engaged.

The movable part is movable to the first position or to the second position, and a specific mode of its motion is not particularly restricted. For example, the movable part may be slidable to move to a first or a second position; otherwise, it may be rotatable to move to the first or second position. However, the movable part should abut on the engagement part to displace it, thereby releasing engagement between the engagement part and the engagement receiving part, at least when moved to the second position.

Each of the aforementioned parts can be formed of any desired material, but is usually formed of plastic material. Also, those parts may be composed partially in combination with metallic parts such that the necessary rigidity and elasticity are provided for those parts.

In the board holder constituted as mentioned above, when the movable part is moved to the second position, it abuts on and displaces the engagement part, thereby releasing the engagement between the engagement part and the engagement receiving part. The movable part does not move out of the second position without an intentional operation to do so. Accordingly, once the movable part is moved to the second position, an operator is not bound by the hindrance of maintaining each engagement part disengaged from the respective engagement receiving part, and he/she can proceed to the next operation of pulling out the board.

Consequently, a detaching operation for the board can be accomplished by one operator without difficulty. And then, even in cases where the board is disposed in an extremely narrow space, such as in a housing of a computer or the like, it is possible for one operator to reach into such a narrow space and conduct his/her operation. As a result, it is no longer necessary to provide a working space for two operators to conduct their respective operations, saving a lot of trouble with the detaching operation for the board.

Now, more specific embodiments of the invention are hereinafter described.

According to a second aspect of the invention, there is provided a board holder in which the movable part is moved between the first and second positions in a direction parallel with the groove.

In the board holder according to the second aspect, since the movable part is moved in parallel with the groove of the main part, a direction in which the board is inserted or pulled out coincides with a direction in which the movable part is moved.

Consequently, when the operator reaches into the narrow space to insert or pull out the board, he/she can disengage the engagement part from the engagement receiving part simply by moving the movable part in a direction in which he/she inserts his/her hands or in a direction in which he/she pulls out his/her hands. Such a board holder enables the operator to conduct an operation of removing the movable part more easily, compared to a board holder in which such a movable part is moved in other directions.

According to a third aspect of the invention, there is provided a board holder in which the engagement part extends from the main part, the movable part comprises a wedge part for intruding between the engagement part and the main part as the movable part is displaced from the first position to the second position, the movable part releases the engagement part from the engagement receiving part by having the wedge part intrude between the engagement part and the main part, thereby separating the engagement part and the engagement receiving part.

In the board holder according to the third aspect, since the movable part comprises the wedge part and displaces the engagement part by having the wedge part intrude between the engagement part and the main part, a direction in which the wedge part is displaced is different from a direction in which the engagement part is displaced.

Consequently, even in cases where force for returning the engagement part, displaced by the wedge part, to its original position acts on the engagement part, and further, such force is transmitted to the wedge part, the force acting in such a direction is not sufficient to return the wedge part to its original position. Accordingly, the state in which the engagement part is disengaged from the engagement receiving part is likely to be maintained.

BRIEF DESCRIPTION OF THE DRAWINGS

The invention will now be described more in detail, by way of example, with reference to the accompanying drawings, in which:

FIGS. 3A, 3B, and 3C are a top plan view, a front view, and a right side view, respectively, of the board holder according to the embodiment;

FIGS. 8A and 8B are vertical sectional views each showing a state in which a sub board is held by a conventional board holder fixed to a main board, with an engagement part being engaged with an engagement receiving part in FIG. 8A, and with the engagement part being disengaged from the engagement receiving part in FIG. 8B.

DESCRIPTION OF THE PREFERRED EMBODIMENT

In the following description of a preferred embodiment of the invention, a circuit board to which a board holder 1 is fixed is referred to as the main board B1, and a board held by the circuit board holder 1 is referred to as the sub board B2.

Figure 1:
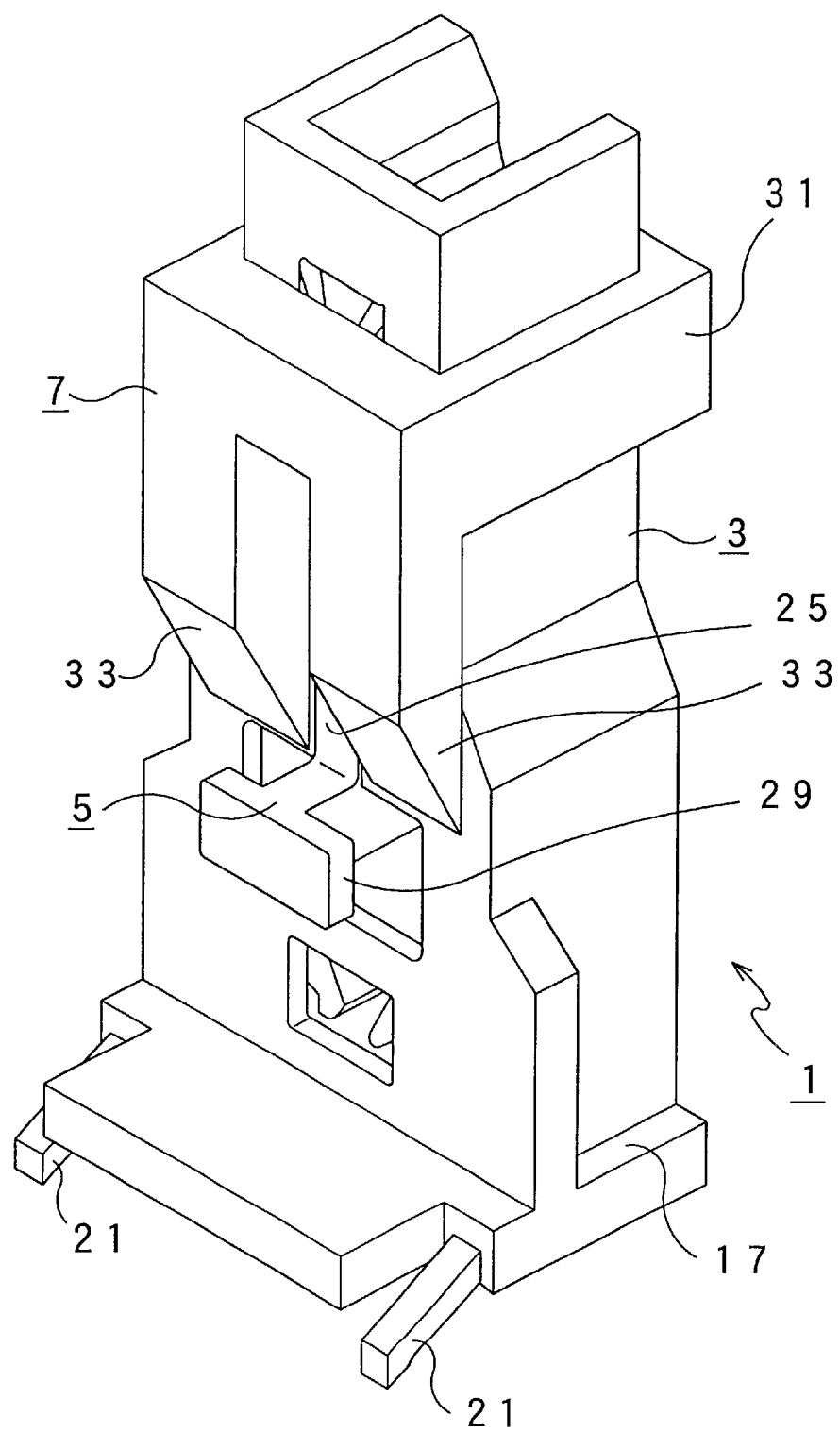
FIG. 1 is a perspective view of a board holder according to an embodiment of the invention.

As shown in FIG. 1, the board holder 1 comprises a main part 3, an engagement part 5 and a movable part 7.

Figure 2:
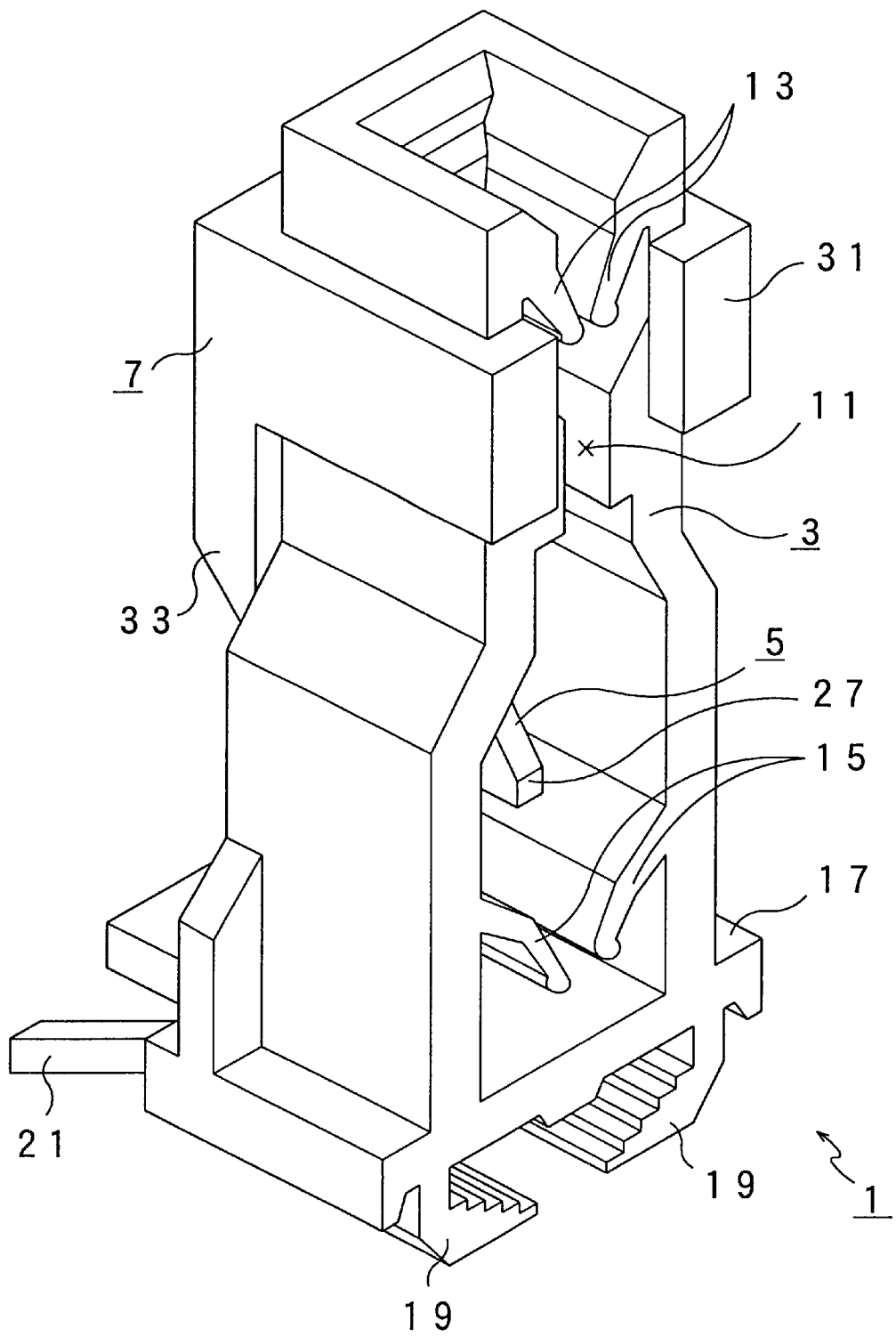
FIG. 2 is another perspective view of the board holder according to the embodiment, seen from a direction different from that of FIG. 1.
Figure 4A:
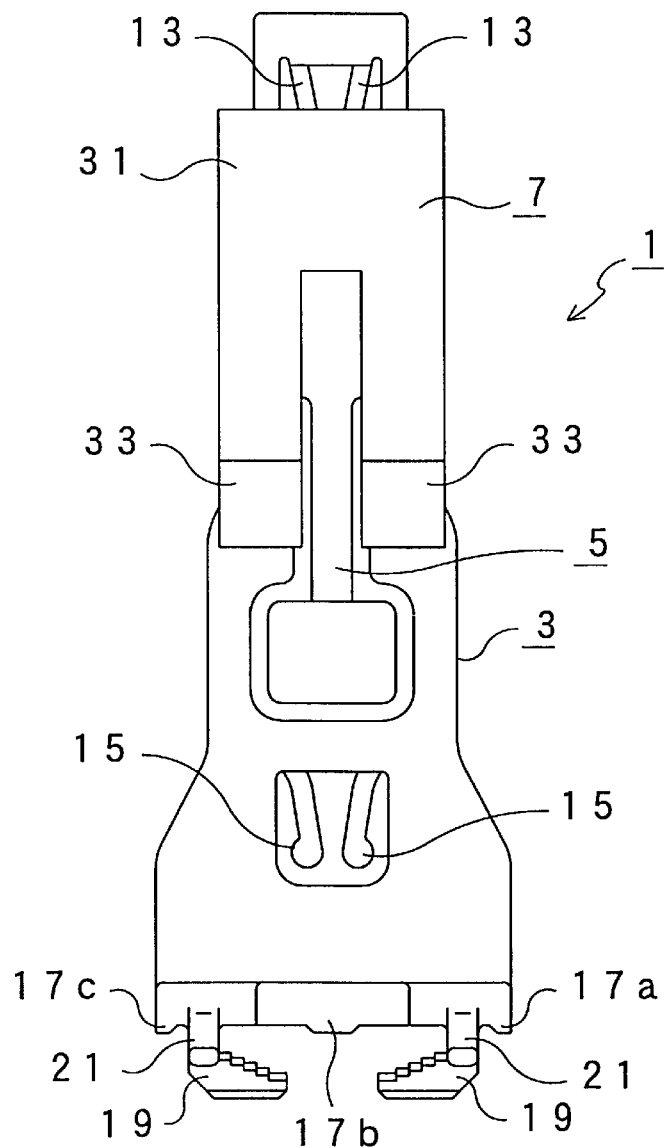
FIG. 4A is a rear view of the board holder according to the embodiment.
Figure 4B:
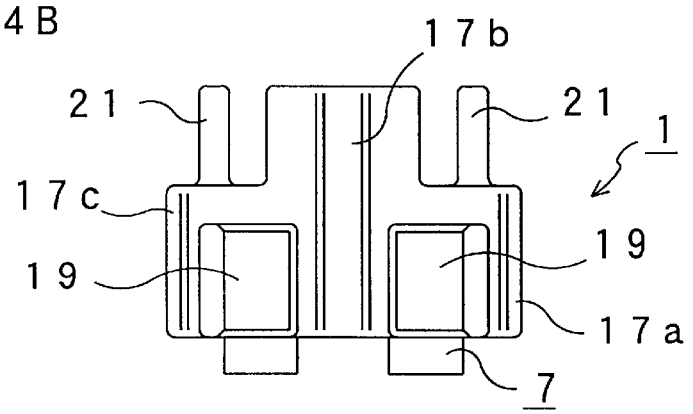
FIG. 4B is a bottom plan view thereof illustrated on the basis of FIG. 4A.

The main part 3 is formed of plastic material and, as shown in FIG. 2, provided with a groove 11 into which the sub board B2 is to be inserted. As shown in FIG. 3B, the groove 11 is extended from a first portion 11a, which is one end of the groove 11, via a second portion 11b, a third portion 11c, a fourth portion 11d, and a fifth portion 11e, to a sixth portion 11f, which is the other end of the groove 11. The first portion 11a of the groove 11 is shaped in such a manner that it is of the greatest width at the end of the groove 11 and becomes narrower as it gets apart therefrom (in other words, as it approaches the second portion 11b) such that the sub board B2 to be inserted from the end of the groove 11 can be introduced into the groove 11 more easily. The second portion 11b of the groove 11 is provided with a pair of elastic pressing pieces 13. Also, the fifth portion 11e of the groove 11 is provided with a pair of elastic pressing pieces 15. The sub board B2 is pinched between the pair of elastic pressing pieces 13 and 15, respectively, and thus prevented from wobbling in the groove 11. Furthermore, the third portion 11c of the groove 11 is of width approximately equal to a thickness of the sub board B2 to be inserted into the groove 11, and by means of the third portion 11c, the sub board B2 is located in position relative to a thickness direction.

The main part 3 is provided with a base 17 at its end. The base 17 is disposed adjacently to the main board B1 as a mounting position, and has protruding rows 17a, 17b and 17c formed on the side facing the main board B1.

Figure 5A:
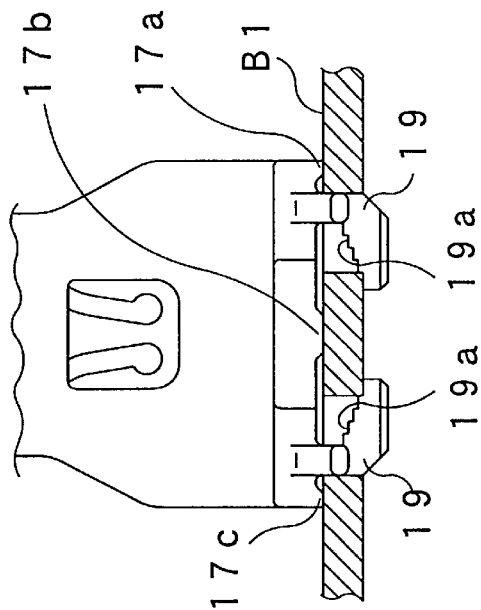
FIG. 5A is a sectional view showing a state in which the board holder according to the embodiment is mounted on a thin main board.
Figure 5B:
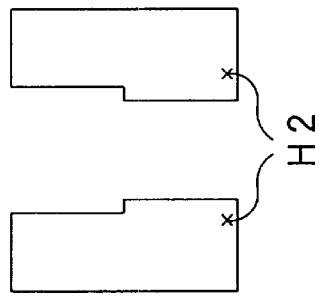
FIG. 5B is a top plan view of a mounting hole formed on the main board illustrated in FIG. 5A.
Figure 5C:
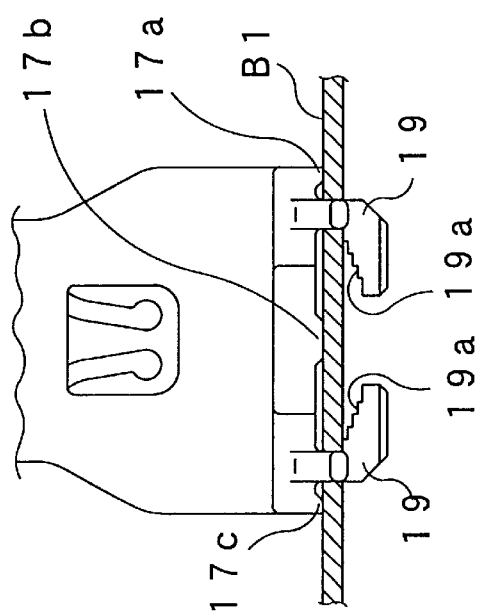
FIG. 5C is a sectional view showing a state in which the board holder according to the embodiment is mounted on a thick main board.
Figure 5D:
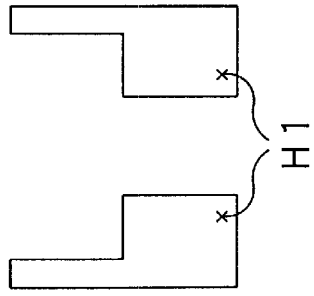
FIG. 5D is a top plan view of a mounting hole formed on the main board illustrated in FIG. 5C.

Also, on the side having the protruding rows 17a to 17c of the base 17, a pair of mounting pieces 19 are prominently provided. Each of the pair of mounting pieces 19 has a stepped pinching face 19a and, as shown in FIGS. 5A and 5C, the main board B1 is pinched by any step of the pinching face 19a and the protruding rows 17a to 17c. In this manner, the board holder 1 can be fixed to various kinds of main boards B1 different in thickness (in case of the embodiment, to the main boards B1 of five kinds in thickness). As shown in FIGS. 5B and 5D, mounting holes H1 and H2 formed on the main board B1 to have the mounting pieces 19 inserted therethrough are differently shaped in accordance with the thickness of the main board B1. More specifically, the mounting holes H1 and H2 are both shaped in such a manner that the width thereof changes in two levels. The width of a broader part is roughly determined such that the mounting piece 19 can be inserted therethrough. On the other hand, the width of a narrower part is optimized according to the thickness of the main board B1 such that the mounting piece 19 is exactly fitted into the narrower part of the mounting hole H1 or H2 when it is slid from the broader part to the narrower part of the mounting hole H1 or H2.

Furthermore, a couple of elastically extending pieces 21 are extended from the base 17. When each of the mounting pieces 19 is slid from the broader part to the narrower part of the mounting hole H1 or H2 as mentioned above, each of the elastically extending pieces 21 is fitted into the broader part of the mounting hole H1 or H2. As a result, each of the elastically extending pieces 21 abuts against an inner wall surface of the mounting hole H1 or H2 at its end, thereby functioning as a stopper for preventing the mounting piece 19 from sliding in such a direction that it returns to the broader part of the mounting hole H1 or H2. Accordingly, owing to this function of the elastically extending pieces 21, the board holder 1 is not easily detached from the main board B1.

Figure 6:
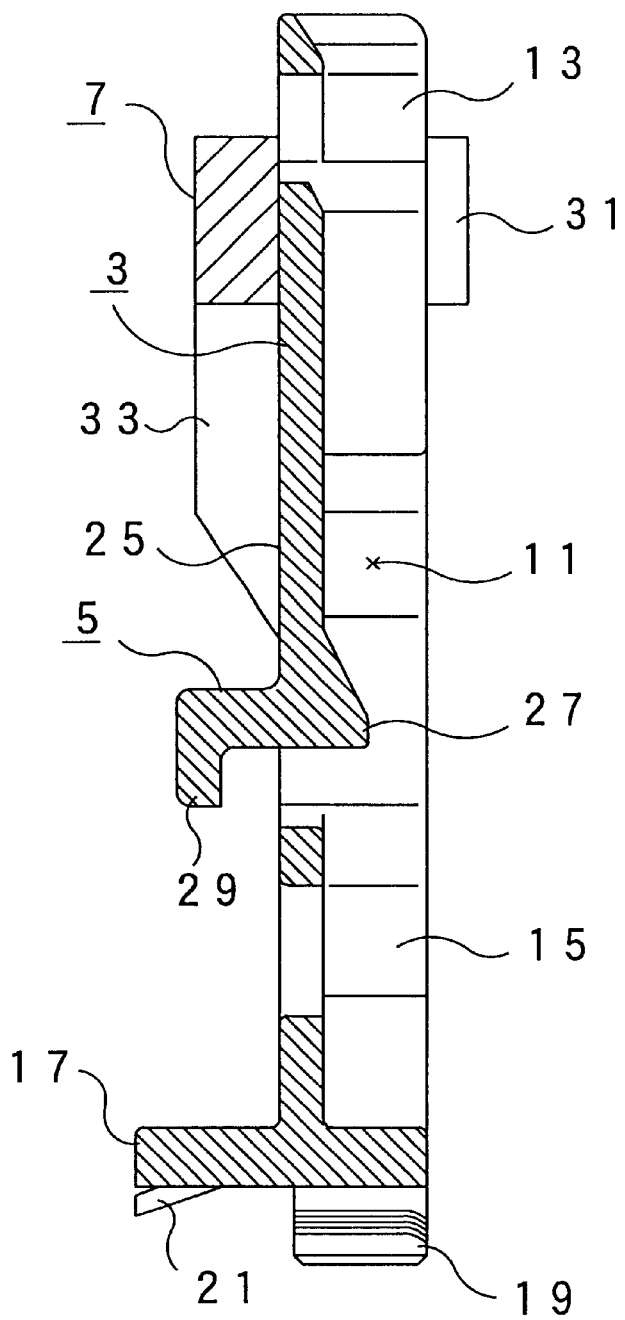
FIG. 6 is a vertical sectional view of the board holder according to the embodiment.

The engagement part 5 is formed of plastic material integrally with the main part 3 and, as shown in FIG. 6, comprises an extending part 25 extended from the main part 3, an engaging claw 27 protruded from an end of the extending part 25 into the groove 11, and an operating part 29 provided at the end of the extending part 25 on the side opposite to the engaging claw 27.

The movable part 7 is also formed of plastic material, but separately from the main part 3 and the engagement part 5. The movable part 7 comprises a peripherally fitting part 31 to be fitted on the periphery of the main part 3 and a wedge part 33 extended from the peripherally fitting part 31. Furthermore, the movable part 7 has a structure slidable along the main part 3.

Figure 7A:
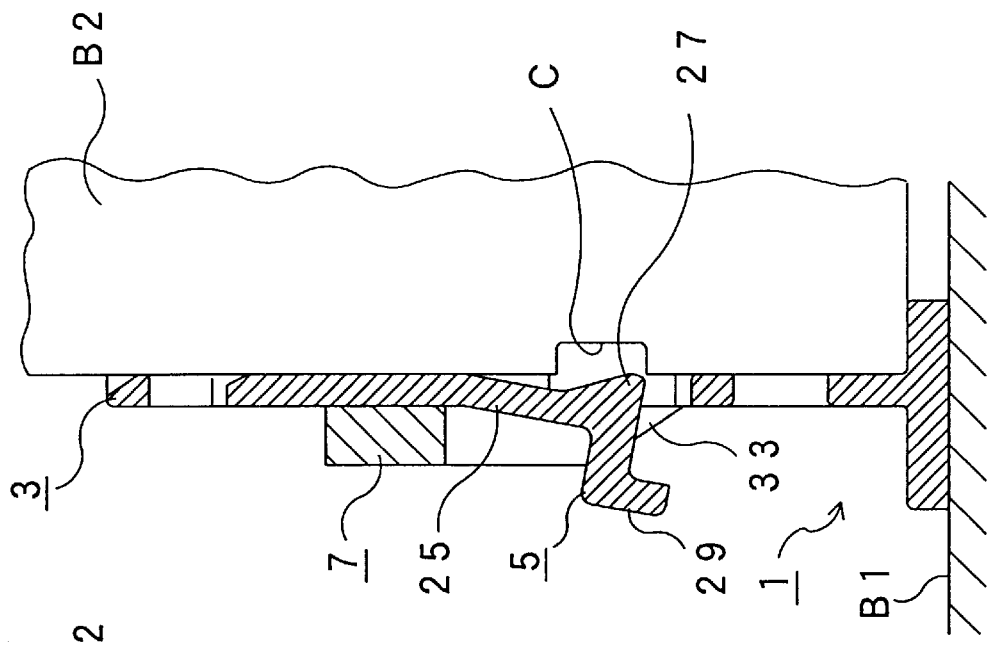
FIGS. 7A and 7B are vertical sectional views each showing a state in which a sub board is held by the board holder according to the embodiment fixed to a main board, with an engagement part being engaged with an engagement receiving part in FIG. 7A, and with the engagement part being disengaged from the engagement receiving part in FIG. 7B.

The board holder 1 constituted as aforementioned is disposed on the main board B1 in a fixed state, as shown in FIG. 7A.

In such a state, in order to set the sub board B2 in the board holder 1, the sub board B2 is inserted from one end of the groove 11. The sub board B2 is guided, along the groove 11, into a proper mounting position. Once the sub board B2 is inserted until it reaches the proper mounting position, the engagement part 5 of the board holder 1 is engaged with an engagement receiving part C, which is formed on the side of the sub board B2. As a result, the sub board B2 is located in the proper mounting position and not removed from the board holder 1.

Figure 7B:
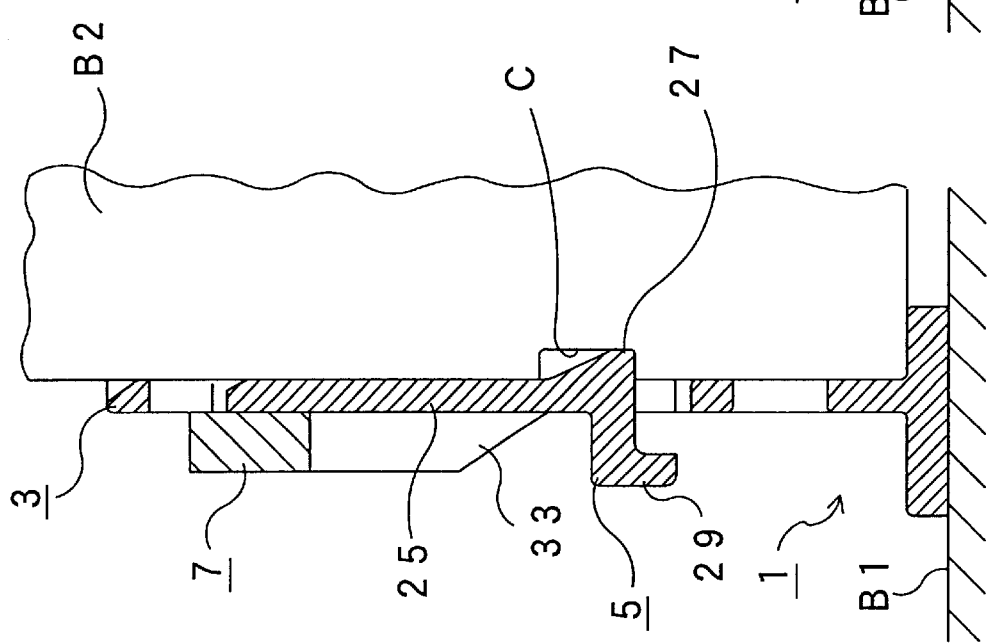

On the other hand, in order to detach the sub board B2 from the main board B1, as shown in FIG. 7B, the movable part 7 is slid toward the main board B1. At this time, the wedge part 33 of the movable part 7 intrudes between the main part 3 and the engagement part 5 (operating part 29) to cause elastic deformation to the extending part 25 of the engagement part 5, thereby disengaging the engagement part 5 from the engagement receiving part C. Then, even if an operator removes his/her hands from the movable part 7, it is not displaced away from the main board B1 and the state in which the engagement part 5 is disengaged from the engagement receiving part C is maintained. Consequently, the operator can proceed to the next operation of pulling out the sub board B2 after releasing the engagement between the engagement part 5 and the engagement receiving part C by sliding the movable part 7.

As aforementioned, according to the board holder 1 of the embodiment, once the movable part 7 is slid to disengage the engagement part 5 from the engagement receiving part C, such a disengaged state can be maintained, which allows the operator to conduct by himself/herself a detaching operation for the sub board B2.

Also, even in cases where the sub board B2 is disposed in an extremely narrow space, for example, in a housing of a computer, it is possible for one operator to reach into the narrow space and conduct the detaching operation. As a result, it is no longer necessary to provide a working space for two operators to conduct their respective operations, which results in saving of a lot of trouble with the detaching operation for the sub board B2.

Furthermore, in the board holder 1 of the embodiment, since the movable part 7 is moved in a direction parallel to the groove 11 of the main part 3, a direction in which the sub board B2 is inserted or pulled out coincides with a direction in which the movable part 7 is moved. Consequently, when the operator reaches into the narrow space to insert or pull out the sub board B2, the operator can release the engagement between the engagement part 5 and the engagement receiving part C simply by moving the movable part 7 in a direction in which he/she inserts his/her hands or in a direction in which he/she pulls out his/her hands. In this case, compared to the cases where such a movable part is moved in other directions, an operation of displacing the movable part 7 can be conducted more easily.

In addition, in the board holder 1 of the embodiment, the movable part 7 has the wedge part 33, which intrudes between the engagement part 5 and the main part 3 to displace the engagement part 5 by elastic deformation. Because of such structure, a direction in which the wedge part 33 is displaced and a direction in which the engagement part 5 is displaced are different from each other. Consequently, even if an elastic force generated with the elastic deformation of the engagement part 5 is transmitted to the wedge part 33, the elastic force acting in such a direction is not sufficient to return the wedge part 33 to its original position. Thus, the state in which the engagement part 5 is disengaged from the engagement receiving part C is likely to be maintained.

The preferred embodiment of the invention has been described above, however, the invention is not restricted to such a specific embodiment and may be embodied in other various ways. For example, as a mounting structure relative to the main board B1, a specific mounting structure by means of the mounting pieces 19 is given in the above described embodiment, however, the mounting structure relative to the main board B1 is not restricted to such a specific one, and any other mounting structure that is well known in the art may be adopted in an appropriate manner.

Also, though the elastic pressing pieces 13 and 15 are provided within the groove 11 in the above described board holder 1, provision of such elastic pressing pieces 13 and 15 is optional.

Furthermore, in the above described board holder 1, although the movable part 7 is slid in parallel to the groove 11 along the main part 3, a specific mode of motion of the movable part is not particularly restricted. For example, it is also feasible for the movable part to be constituted in such a manner that it can be rotated to displace the engagement part.

In addition, in the above described board holder 1, the pair of elastically extending pieces 21 are provided to prevent the board holder 1 from being easily detached from the main board B1. For example, however, in cases where the structure in which the board holder 1 is easily detachable from the main board B1 is desirable in view of recycling and disposing by type of the parts, the elastically extending pieces 21 do not necessarily need to be provided. Without the pair of elastically extending pieces 21, the board holder 1 can be freely mounted on or removed from the main board B1 only by conducting a simple operation of sliding the board holder 1 along the surface of the main board B1.

However, even in cases where the elastically extending pieces 21 are not provided, any device should be adopted such that the board holder 1 is not easily slidable at least while holding the sub board B2. For this purpose, for example, in cases where the sub board B2 is inserted into and held between a pair of the board holders 1 opposed to and separated from each other at a first distance, it is recommended that a physical relationship between the broader part of the mounting hole H1 or H2 and the narrower part thereof should be determined such that, when each of the pair of the board holders 1 is first inserted into the main board B1 with a second distance, which is narrower than the first distance, provided therebetween, and the board holders 1 are subsequently slid away from each other, the pair of the board holders 1 are positioned apart from each other at the first distance. In this case, the board holders 1 are not detachable from the main board B1 unless they are slid toward each other, that is, in such a direction that the distance between the pair of the board holders 1 is narrowed. Accordingly, while the pair of the board holders 1 are holding the sub board B2 therebetween, sliding movement of the board holders 1 is prevented by the sub board B2. On the contrary, in cases where the board holder 1 is provided with the elastically extending pieces 21, the board holder 1 is not easily detachable from the main board B1 by itself, and thus, the aforementioned device relating to the physical relationship between the broader part and the narrower part of the mounting hole H1 or H2 is not necessary to be considered.

Moreover, the pair of mounting pieces 19 may be combined with each other at there respective ends. In this case, two broader parts of the mounting hole H1 or H2, which comprises a pair of openings in the above described embodiment, are also combined with each other to form an integrally united opening, thereby allowing the board holder 1 to be fixed on the main board B1 via the integrally combined mounting piece 19. The mounting piece 19 combined as an integral member is more difficult to be broken off compared to the pair of mounting pieces 19 provided as separate members. In other words, by forming the mounting piece 19 as an integrally combined member, it is more unlikely to happen that the mounting piece 19 is broken and the board holder 1 is thus detached from the main board B1, even when any load is applied to the board holder 1 after the board holder 1 is fixed on the main board B1.

What is claimed is:

1. A board holder for supporting a circuit board upstanding on a mother board or a panel, the board holder comprising:
   a main part having a guide into which said circuit board is insertable for guiding said circuit board along said guide into a mounting position;
   an engagement part for retaining an engagement receiving part formed on the side of said circuit board when said circuit board is inserted along said guide of said main part into said mounting position; and
   a movable part having a first position where said movable part does not disturb engagement between said engagement part and said engagement receiving part, and a second position where said movable part abuts and displaces said engagement part from retention of said engagement receiving part.

2. The board holder according to claim 1, wherein said movable part is moved between said first and second positions in a direction parallel with said guide.

3. The board holder according to claim 1, wherein said engagement part extends from said main part, said movable part comprises a wedge for intruding between said engagement part and said main part as said movable part is displaced from said first position to said second position, said movable part releases said engagement part from said engagement receiving part by having said wedge intrude between said engagement part and said main part, thereby separating said engagement part and said engagement receiving part.

4. The board holder according to claim 1, wherein said guide is provided with at least a pair of inwardly biased elastic pressing pieces to facilitate contact and secure engagement of said circuit board within said guide.

5. The board holder according to claim 4, wherein said guide is provided with a wider entrance portion, a narrower intermediate portion and a wider base portion.

6. The board holder according to claim 5, wherein said at least one pair of inwardly biased elastic pressing pieces are positioned in one of the wider top portion and wider lower portion of the guide.

7. The board holder according to claim 1, further comprising at least a pair of stepped mounting pieces forming a mounting portion of the main part for fixing the main part to said mother board or said panel, said mounting pieces having mutually inwardly facing stepped surfaces for engaging different thicknesses of mother boards or panels.

8. The board holder according to claim 7, wherein the mounting portion further comprises at least an elastically extending piece for biasly engaging a portion of a mounting hole in the mother board or the panel with respect to a surface of the mother board or the panel.

9. The board holder according to claim 8, wherein the pair of mounting pieces are inserted in a respective first and second hole in the mother board or the panel, each said first and second holes having a wider portion into which the mounting pieces can be perpendicularly inserted through the mother board or the panel and a narrower portion adjacent the wider portion of each said hole for engaging the inwardly facing stepped surfaces of the mounting pieces when the mounting pieces are slid parallel with respect to the mother board or the panel.

10. The board holder according to claim 9, wherein the elastically extending pieces are biased perpendicularly with respect to the mother board or the panel such that when the main part is slid parallel with respect to the mother board or the panel and the stepped mounting pieces are slid into the narrower portions of the first and second holes, the elastically extending pieces engage and depend into the broader portions of the first and second holes to fix the main part in the first and second holes with the guide aligned in a substantially perpendicular manner with respect to the mother board or the panel.

11. A method of affixing a circuit board in a mounting position to a mother board or a panel and detaching said circuit board therefrom using a board holder, the method comprising the steps of:

upstanding and fixing a main part in the vicinity of said mounting position, the main part having a guide into which said circuit board is insertable for guiding said circuit board along said guide into said mounting position;

supporting said circuit board on said mother board or said panel by retaining an engagement receiving part formed on the side of said circuit board by an engagement part when said circuit board is inserted along said guide of said main part into said mounting position; and pulling said circuit board out of said guide after moving a movable part from a first position where said movable part does not disturb engagement between said engagement part and said engagement receiving part to a second position where said movable part abuts and displaces said engagement part from retention of said engagement receiving part.

* * * * *